United States Patent
Hsu

(10) Patent No.: US 7,592,706 B2
(45) Date of Patent: Sep. 22, 2009

(54) MULTI-LAYER CIRCUIT BOARD WITH FINE PITCHES AND FABRICATING METHOD THEREOF

(75) Inventor: Shih-Ping Hsu, Taoyuan County (TW)

(73) Assignee: Phoenix Precision Technology Corporation, Hsin-Chu (TW)

( * ) Notice: Subject to any disclaimer, the term of this patent is extended or adjusted under 35 U.S.C. 154(b) by 511 days.

(21) Appl. No.: 11/160,413

(22) Filed: Jun. 22, 2005

(65) Prior Publication Data

US 2006/0131176 A1    Jun. 22, 2006

(30) Foreign Application Priority Data

Dec. 21, 2004   (TW) ................ 93139852 A

(51) Int. Cl.
*H01L 23/48* (2006.01)
*H01L 29/40* (2006.01)

(52) U.S. Cl. .................. 257/777; 257/E23.169; 174/254; 29/739; 205/125; 361/748

(58) Field of Classification Search ............... 361/748, 361/750, 751; 257/777, E23.169; 205/125; 174/254; 29/739
See application file for complete search history.

(56) References Cited

U.S. PATENT DOCUMENTS

| | | | | |
|---|---|---|---|---|
| 4,729,061 A | * | 3/1988 | Brown | 361/719 |
| 5,578,796 A | * | 11/1996 | Bhatt et al. | 174/260 |
| 6,214,525 B1 | * | 4/2001 | Boyko et al. | 430/313 |
| 6,359,235 B1 | * | 3/2002 | Hayashi | 174/260 |
| 6,478,088 B1 | * | 11/2002 | Hansen et al. | 166/285 |
| 6,718,631 B2 | * | 4/2004 | Takeuchi | 29/852 |
| 6,734,542 B2 | * | 5/2004 | Nakatani et al. | 257/687 |
| 6,977,348 B2 | * | 12/2005 | Ho et al. | 174/255 |
| 7,057,290 B2 | * | 6/2006 | Sunohara et al. | 257/777 |
| 2007/0281464 A1 | * | 12/2007 | Hsu | 438/624 |

* cited by examiner

*Primary Examiner*—W. David Coleman
(74) *Attorney, Agent, or Firm*—Winston Hsu

(57) ABSTRACT

A method for fabricating a multi-layer circuit board with fine pitch is provided. First, a plurality of contact pads is disposed on a core substrate. Next, a first dielectric layer, a second dielectric layer, and a third dielectric layer are formed on the core circuit board, in which a plurality of patterned openings are formed in the third dielectric layer and a plurality of vias is formed in the first and second dielectric layer, and the vias are located at the openings corresponding to the contact pads. Next, a conductive seed layer is disposed on the patterned openings and vias and a conductive layer is disposed on the conductive seed layer for forming circuit in each patterned opening and conductive via. Finally, removing the conductive layers and the conductive seed layer on the surface of third dielectric layer and forming a separation for each conductive circuit at each opening.

6 Claims, 9 Drawing Sheets

MULTI-LAYER CIRCUIT BOARD WITH FINE PITCHES AND FABRICATING METHOD THEREOF

BACKGROUND OF THE INVENTION

1. Field of the Invention

The present invention relates to a method of fabricating a multi-layer circuit board, and more particularly, to a method of fabricating a multi-layer circuit board with fine pitches.

2. Description of the Prior Art

In the past, various build-up layer methods of high-density IC package substrates and printed circuit boards for achieving finer pitch and multiple layers have been disclosed, including laminations of dielectric films, resin-coated copper (RCC), and prepreg.

Recently, a more advanced build-up method has been introduced by providing an insulating core layer with completed upper circuit layers and lower circuit layers, in which the upper and lower circuit layers are electrically connected. To establish the connection between the upper and lower circuit layers, a plurality of plated though holes (PTH) is formed in the core layer to connect upper and lower circuit layers. Next, a laminating process is utilized to form a dielectric layer onto the core layer and form a plurality of vias by laser drilling on the dielectric layer to expose the contact pads of circuit layers. Next, a conductive seed layer is formed over the surface of the dielectric layer, and then utilizing a photolithography process to form patterned photoresist layer with recesses to expose the vias. Fabricating an electroplating process, a conductive material is formed into the via and the recess of patterned photoresist layer, and then removing the photoresist layer and the exposed conductive seed layer under photoresist layer, a build-up circuit layer is formed and the entire fabrication process is referred to as a semi additive process (SAP).

In general, packaging substrates and printed circuit boards that utilize the SAP methods are able to achieve precise fine pitches with line-width/line-space (L/S) of 20 µm/20 µm, in which the shape of the lines are able to obtain good resistance control and electrical properties. Eventually, the build-up method can be applied to various higher-level printed circuit boards such as flip chip IC packaging substrate.

Nevertheless, numerous difficulties with this technique are yet to be solved as is evident by the various disadvantages that still exist with SAP fabrication. One disadvantage occurs as the lines get finer, such as reaching a L/S of 10 µm/10 µm. At this point the integration of conductive lines and dielectric layers unavoidably becomes much worse, thereby causing problems such as cracks or delaminations. Additionally, as the circuit layout get into fine pitches, the photomasks utilized during fabrication processes are easily trapped within the space between each line, thereby affecting the quality and electrical property of the product. Moreover, the etching process utilized during standard SAP processes for removing the conductive seed layer influences the precision of the shape and size (line width) of the fine lines.

SUMMARY OF THE INVENTION

It is therefore an objective of the present invention to provide a method of fabricating multi-layer circuit board with fine pitches for solving the above-mentioned problems.

According to the present invention, a method of fabricating a multi-layer packaging substrate comprising: providing a core substrate, wherein the core substrate comprises a plurality of contact pads thereon; forming a first dielectric layer over the surface of the core substrate; forming a second dielectric layer over the surface of the first dielectric layer; forming a third dielectric layer over the surface of the second dielectric layer; forming a plurality of patterned openings within the third dielectric layer; forming a plurality of via within the first dielectric layer and the second dielectric layer, wherein the vias are located at the openings corresponding to the contact pads; forming a conductive seed layer on the surface of the third dielectric layer, the patterned openings, and the via; electroplating a conductive metal layer on the conductive seed layer for forming circuit in each patterned opening and conductive vias in each vias; and removing the electroplated conductive metal layer and the conductive seed layer over the surface of the third dielectric layer for forming a separation for each conductive circuit at each patterned opening.

Another objective of the present invention is to provide a build-up layer circuit board with fine pitches. The build-up layer circuit board comprising: a core substrate having a plurality of contact pads thereon; a first dielectric layer on the surface of the core substrate; a second dielectric layer on the surface of the first dielectric layer; a plurality of conductive vias corresponding to the contact pads within the first dielectric layer and the second dielectric layer; a third dielectric layer on the surface of the second dielectric layer; and a plurality of circuit formed in a patterned opening within the third dielectric layer, wherein the circuit are electrically connected to the contact pads through the conductive vias.

By providing a method of forming a plurality of patterned openings and via within a dielectric layer and depositing conductive metals into each pattern opening and via, the present invention is able to achieve a packaging substrate with much finer pitches, a simplified fabrication process, lower costs, and an increase in the overall product yield.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
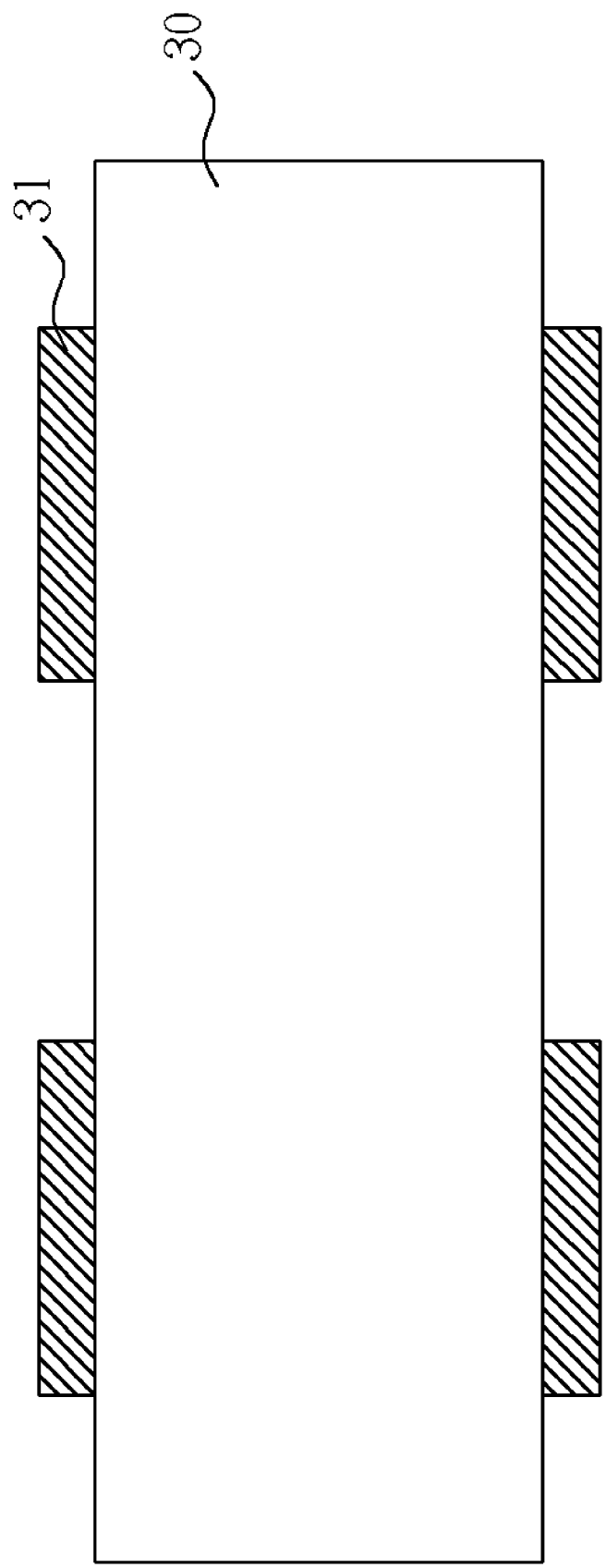
FIG. 1 through FIG. 7 are perspective diagrams showing a method of fabricating a multi-layer circuit board with fine pitches according to the first embodiment of the present invention.
Figure 2:
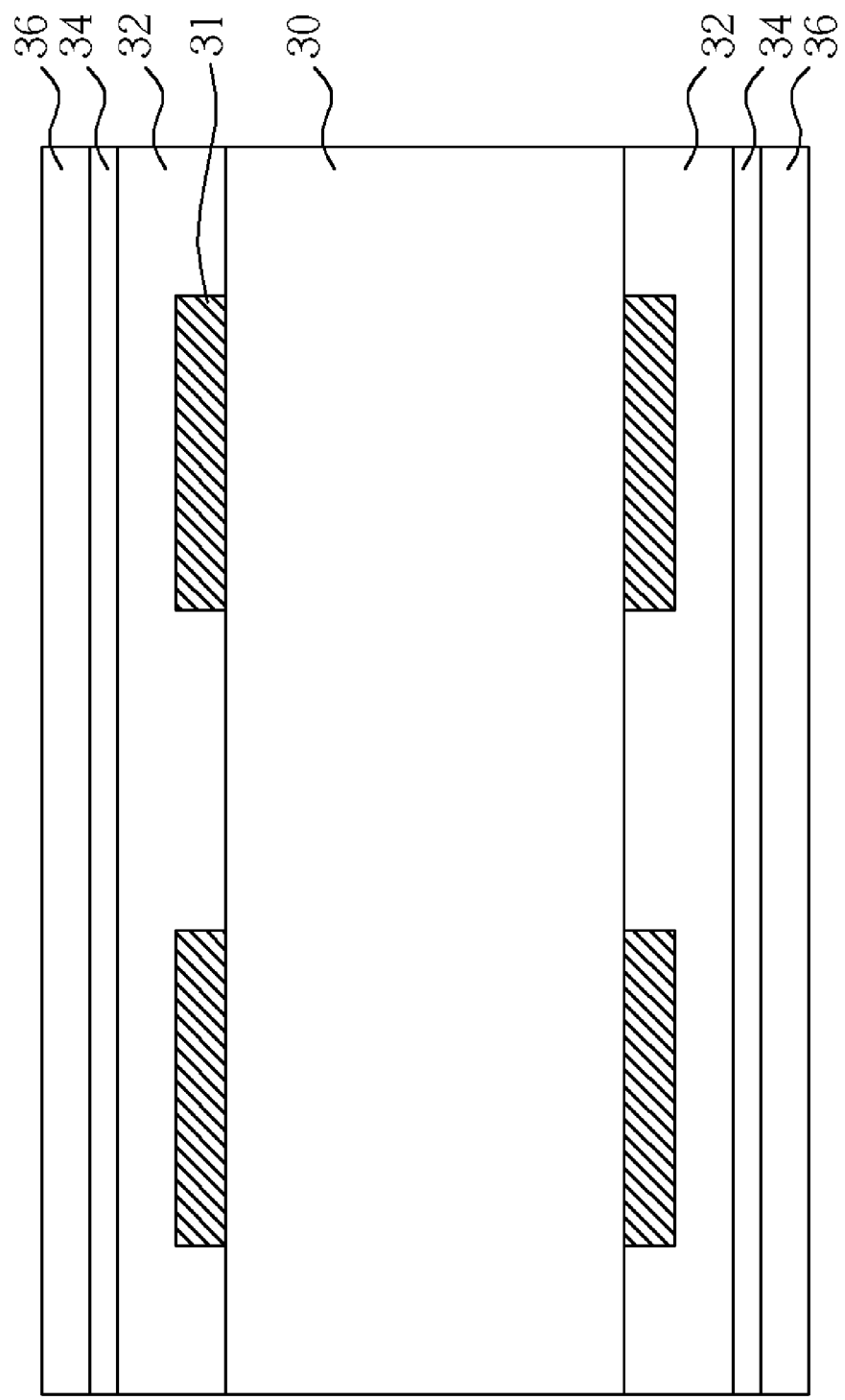

Please refer to FIG. 1 through FIG. 7. FIG. 1 through FIG. 7 are perspective diagrams showing a method of fabricating a multi-layer circuit board with fine pitches according to the first embodiment of the present invention. As shown in FIG. 1, a core substrate 30 is provided, in which a plurality of contact pads 31 is included over the surface of the substrate 30. Preferably, the core substrate is a double layer circuit board, a multi-layer circuit board, an organic insulating substrate, an inorganic insulating substrate, a ceramic substrate, or a metal core. Next, a first dielectric layer 32 is formed over the surface of the core substrate 30, as shown in FIG. 2. Next, a second dielectric layer 34 is formed over the surface of the first dielectric layer 32 and a third dielectric layer 36 is formed over the surface of the second dielectric layer 34, in which the first dielectric layer 32, the second dielectric layer 34, and the third dielectric layer 36 can be comprised of photosensitive or non-photosensitive materials and are formed utilizing processes including: laminating, coating, vacuum pressing, or printing. Additionally, the second dielectric layer 34, and the third dielectric layer 36 are comprised of different materials. Alternatively, a composite layer (not shown) can be formed over the surface of the core substrate 30, in which the composite layer includes the first dielectric layer 32, the second dielectric layer 34, and the third dielectric layer 36. Next a laminating process is performed by laminating the first dielectric layer 32 of the composite layer to the core substrate 30 to form the multi-layer circuit board, as shown in FIG. 2.

Figure 3:
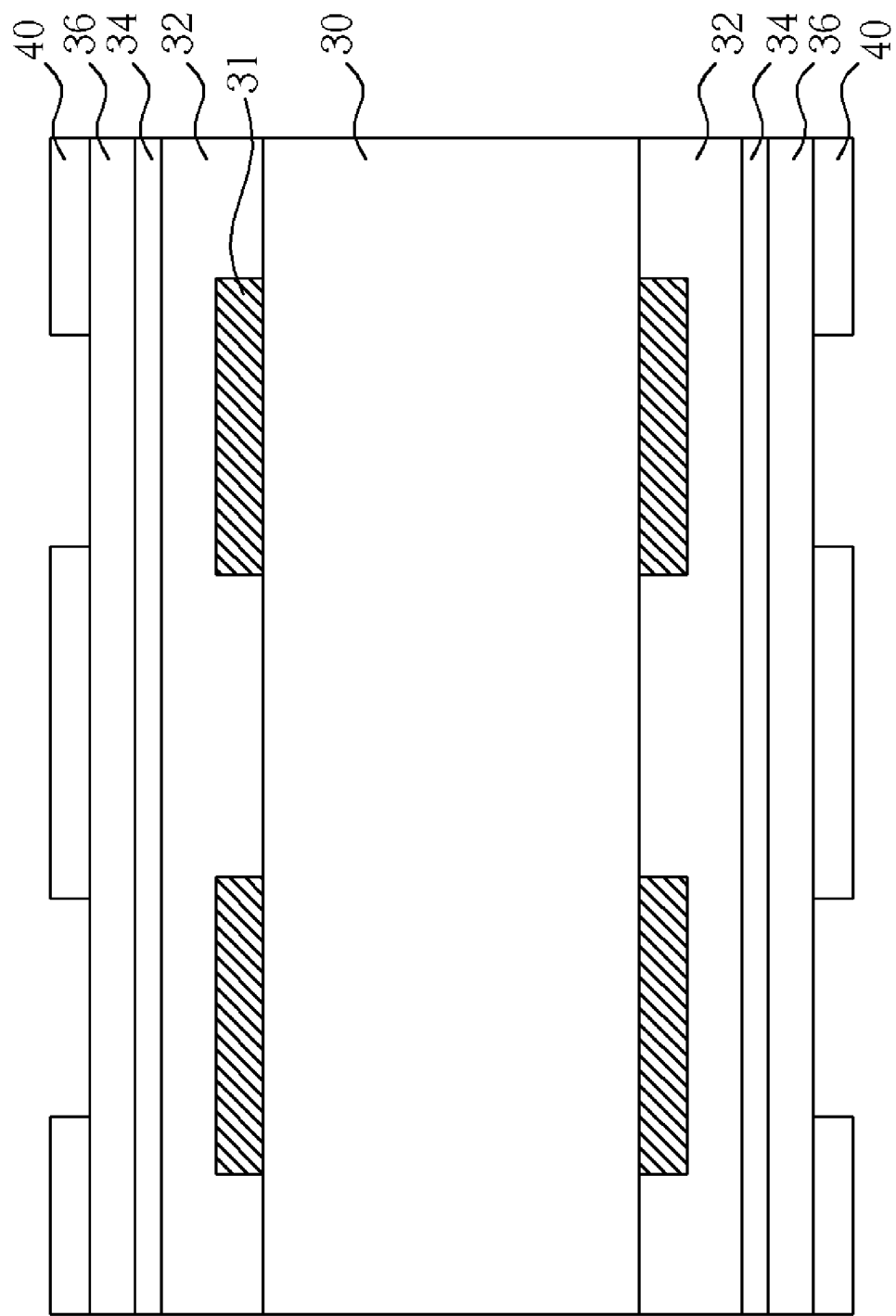
Figure 4:
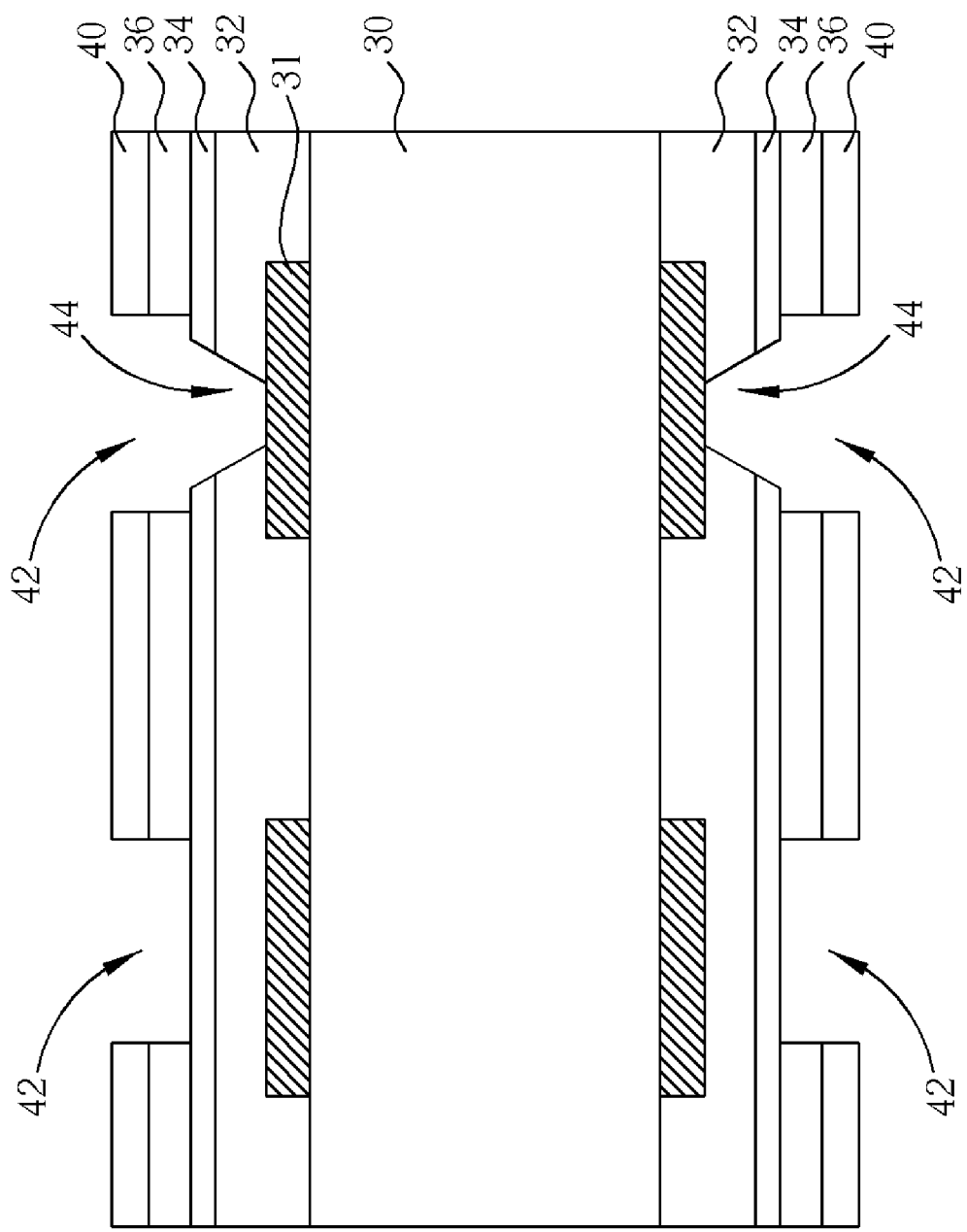

Next, a patterned resistive 40 is formed over the surface of the third dielectric layer 36 to define the location of the patterned openings and vias as shown in FIG. 3 and FIG. 4. By utilizing the patterned resistive 40, a circuit pattern transfer is performed by processes including: dry etching, reaction ion etching, laser drilling, chemical development, or a combination of these processes to form a plurality of patterned openings 42 within the third dielectric layer 36 and a plurality of vias 44 within the first dielectric layer 32 and the second dielectric layer 34, in which the vias 44 are located at the openings 42 corresponding to the contact pads 31. For instance, when the third dielectric layer 36 is comprised of photosensitive material and the second dielectric layer 34 is comprised of non-photosensitive material, a photo development process is performed on the third dielectric layer 36. This photo development process can use the photomask as a patterned resistive 40 to form the patterned openings 42 in which the second dielectric layer 34 is serving as a developing-stopping layer to stop the developing process at the surface of the second dielectric layer 34. Next, a laser drilling, reaction ion etching, or plasma ion etching process is performed on the second dielectric layer 34 and the first dielectric layer 32 to form the vias 44, in which the vias 44 are located at the openings 42 corresponding to the contact pads 31 formed on the surface of the core substrate 30.

Alternatively, when the third dielectric layer 36 is comprised of non-photosensitive material and the second dielectric layer 34 is a material not sensitive to etching processes thereby turning the second dielectric layer 34 into an etching stop layer. Next, an etching process is performed on the third dielectric layer 36 utilizing a photoresist layer as the patterned resistive 40 for etching process. This etching process is stopped at the surface of the second dielectric layer 34. Next, a laser drilling, reaction ion etching, or plasma ion etching process is performed to penetrate the second dielectric layer 34 and the first dielectric layer 32 corresponding to the contact pads to form a plurality of vias 44. Preferably, the patterned resistive 40 is formed by various processes including: laminating, molding, coating, printing, sputtering, or non-electroplating and materials chosen from dry films, liquid photoresist, or metal masks.

Figure 5:
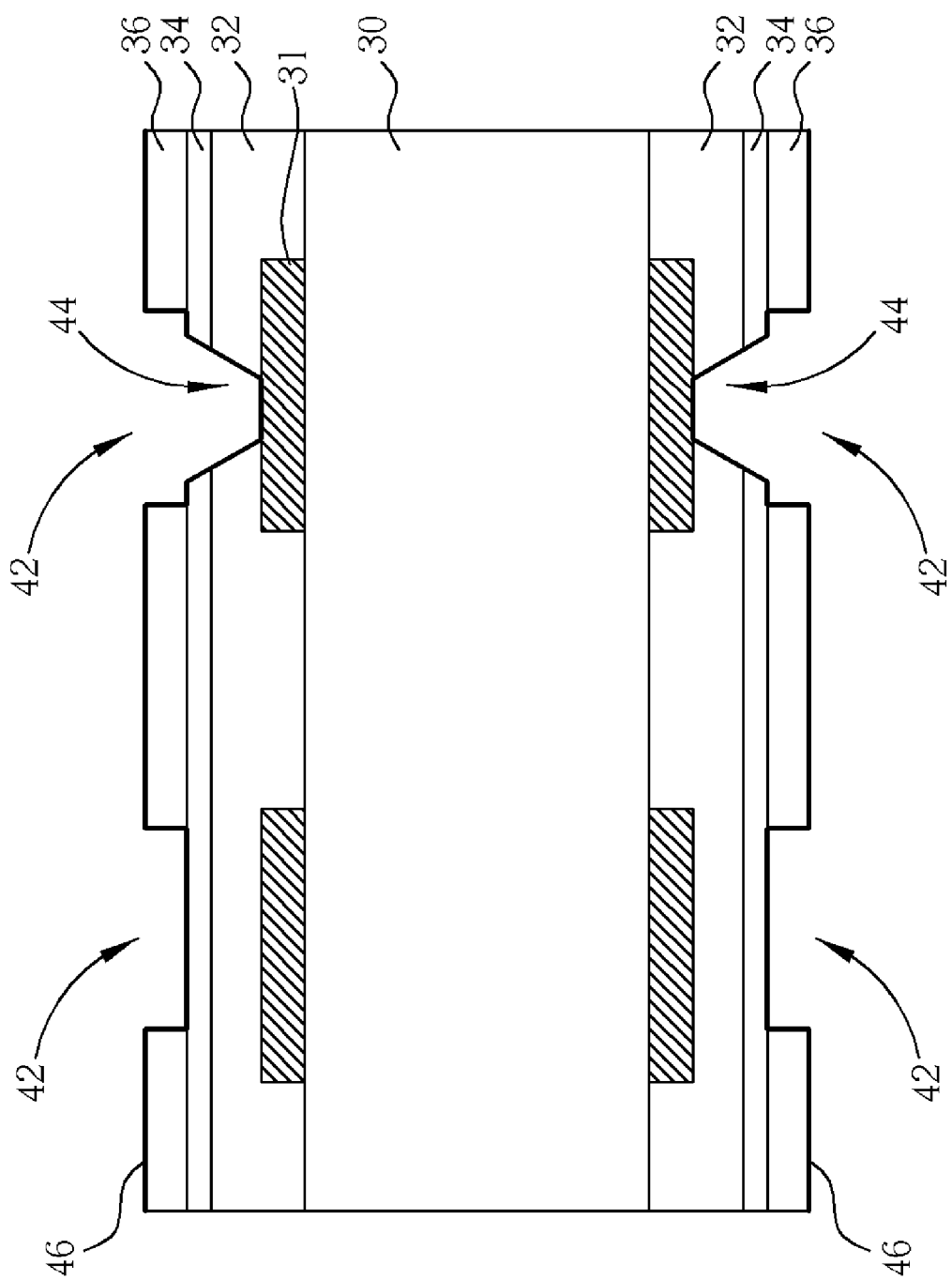
Figure 6:
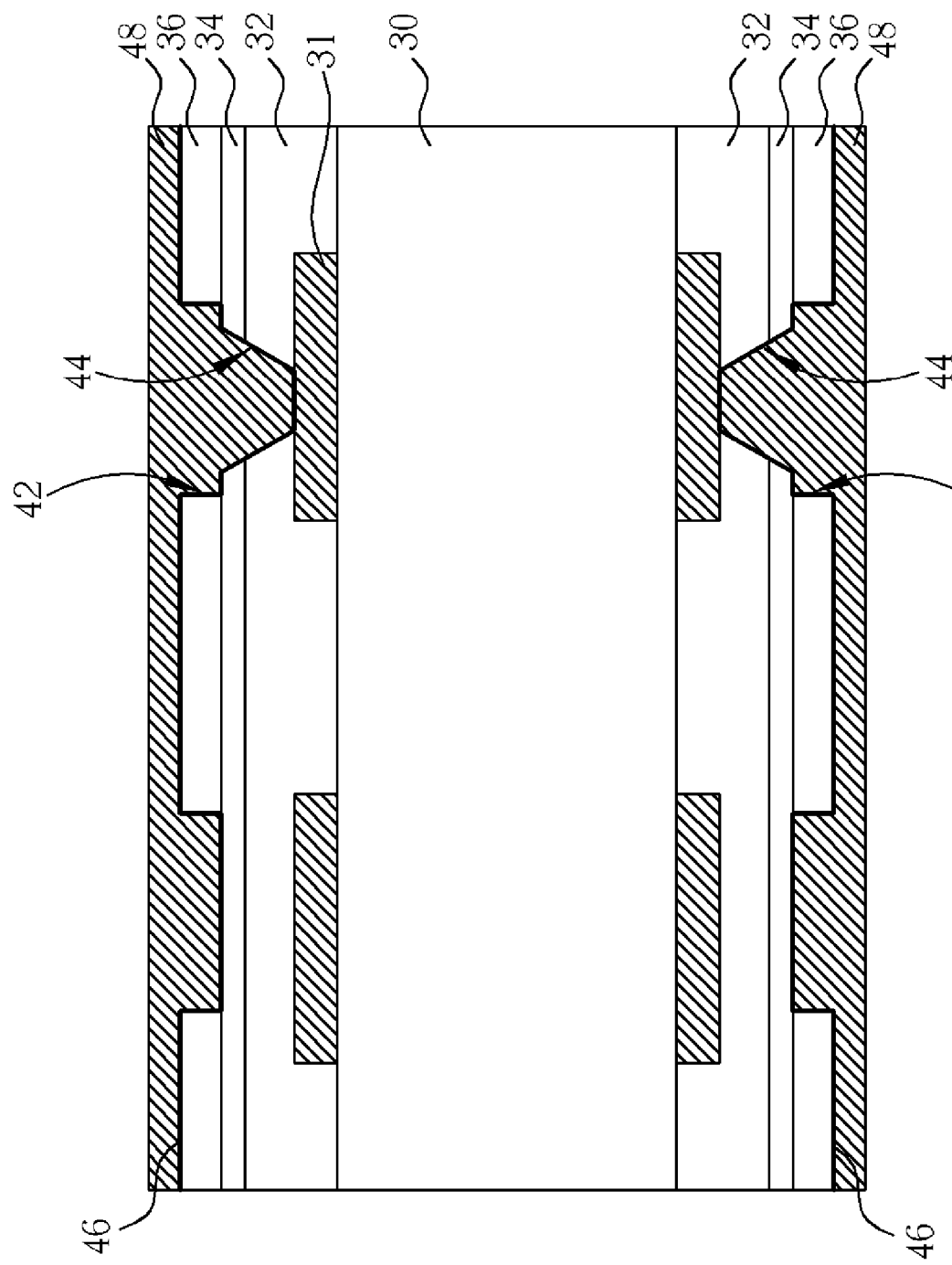
Figure 7:
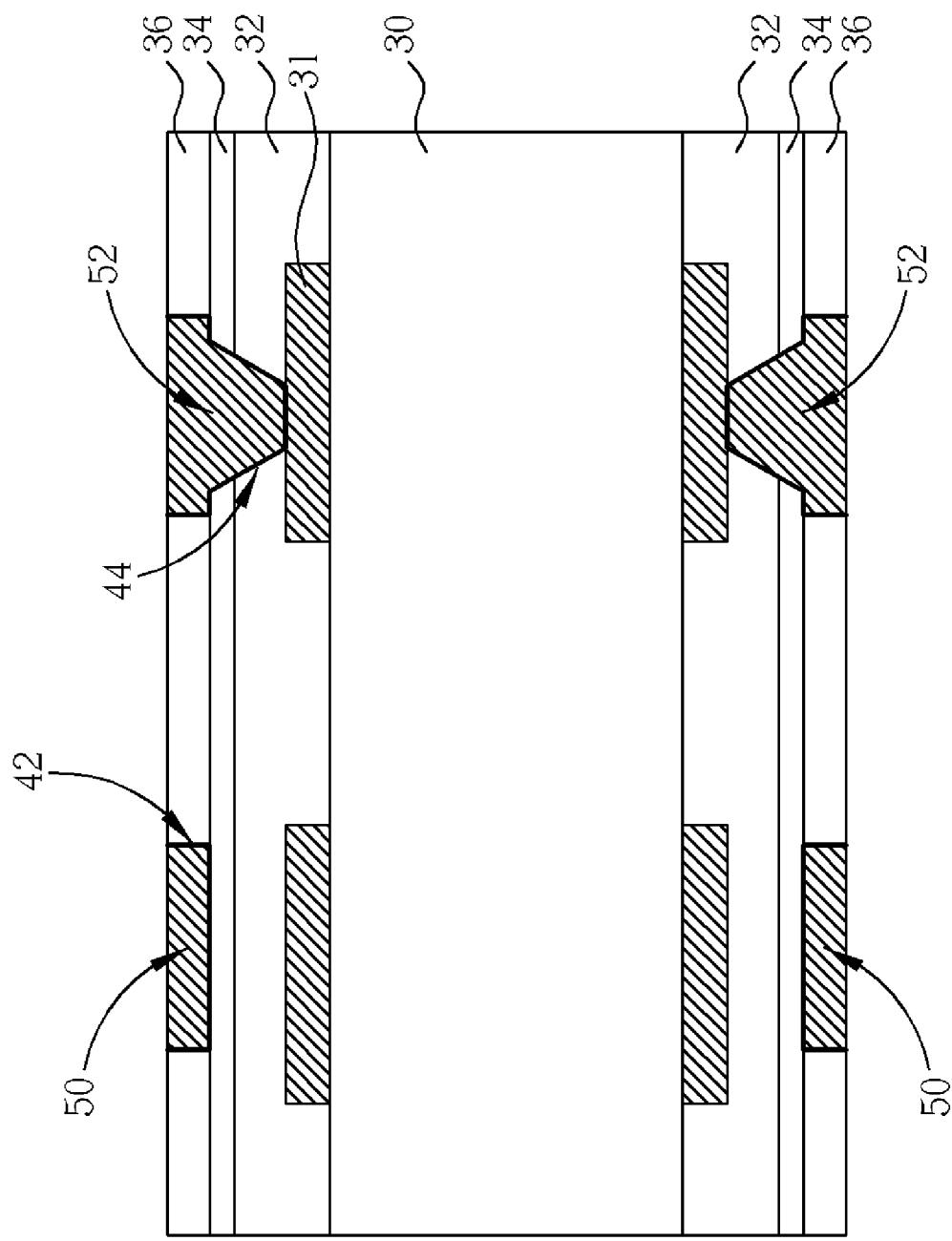

Next, a conductive seed layer 46 is formed over the surface of the third dielectric layer 36, each patterned opening 42, and each vias 44, as shown in FIG. 5. Preferably, the conductive seed layer 46 is formed by various methods including physical vapor deposition (PVD) such as sputtering, evaporation, arc vapor deposition, ion beam sputtering and laser ablation deposition, chemical vapor deposition (CVD), plasma enhanced CVD, or chemical deposition. Additionally, the conductive seed layer 46 can be comprised of conductive materials or conductive polymers including: chromium, copper, tantalum, gold, silver, titanium, or nickel. Next, a conductive metal layer 48 is electroplated onto the conductive seed layer 46 and into each patterned opening 42 and each vias 44, as shown in FIG. 6. Finally, an etching and planarizing process is performed to remove the conductive seed layer 46 and the conductive metal layer 48 from the surface of the third dielectric layer 36 to form circuit 50 and conductive vias 52, as shown in FIG. 7. Preferably, the conductive metal layer 48 disposed into each patterned opening 42 and each via 44 is at the same level as the surface of the third dielectric layer 36. It should be noted that the process can also be performed repeatedly on both sides of the core substrate 30 to form a multi-layer circuit board.

As shown in FIG. 7, the present invention discloses a second build-up layer circuit board with fine pitches. The build-up layer circuit board includes a core substrate 30, in which the substrate includes: a plurality of contact pads 31 thereon, a first dielectric layer 32 disposed over the surface of the core substrate 30, a second dielectric layer 34 disposed on the first dielectric layer 32, and a third dielectric layer 36 disposed on the second dielectric layer 34, in which the first dielectric layer 32 and the second dielectric layer 34 include a plurality of vias 44 corresponding to the contact pads 31 of the core substrate 30, and the vias 44 further includes conductive via 52 therein. The third dielectric layer 36 on the other hand, includes a plurality of patterned openings 42, and the patterned openings further include circuit 50 therein. The circuit 50 is electrically connected to the contact pads 31 through the conductive vias 52 and the third dielectric layer 36 is utilized to create a separation for the circuit 50.

Figure 8:
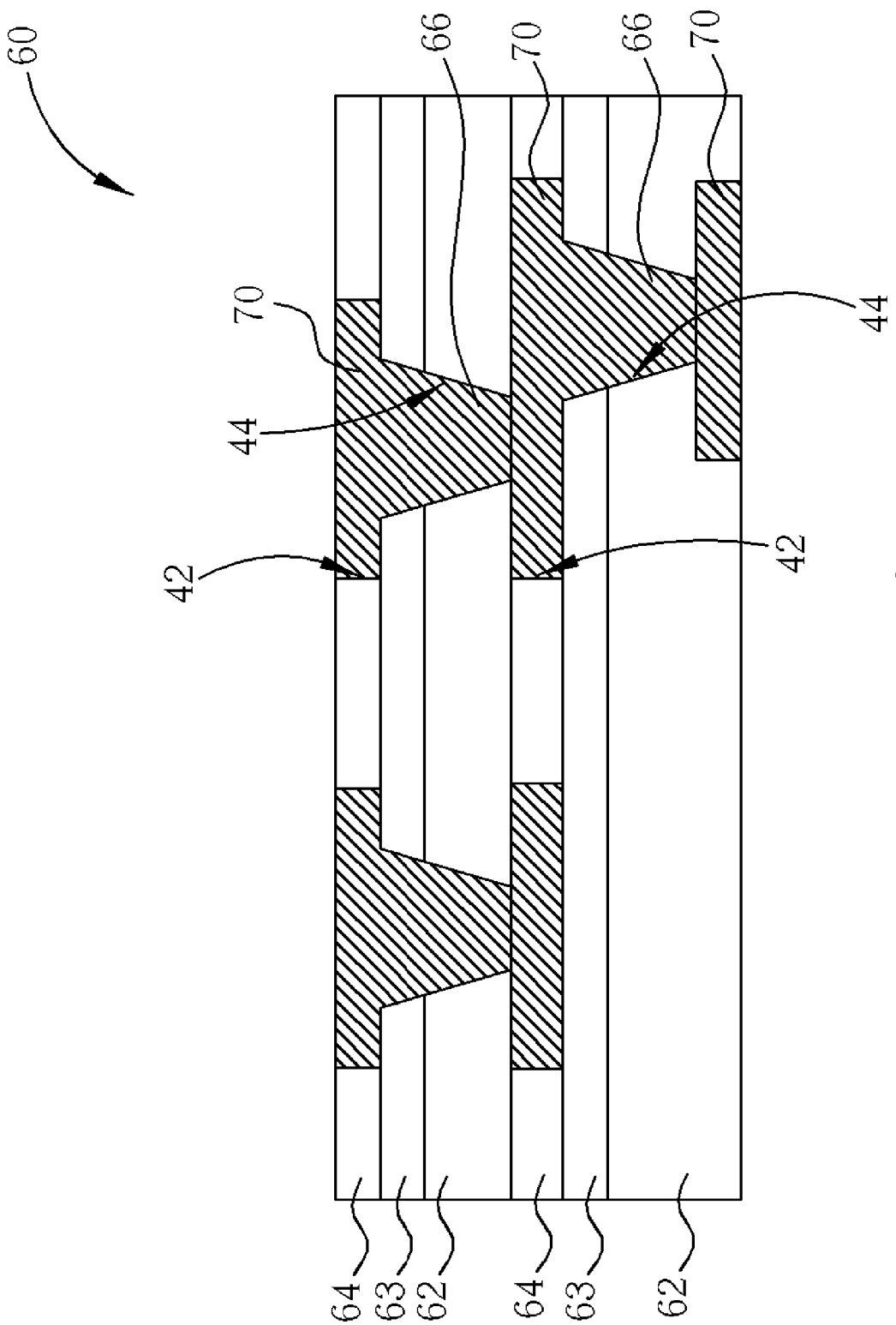
FIG. 8 is a perspective diagram showing the build-up circuit board with fine pitches of the multi-layer circuit board according to the present invention.

Please refer to FIG. 8. FIG. 8 is a perspective diagram showing the build-up layer circuit board 60 with fine pitches according to the second embodiment of the present invention. As shown in FIG. 8, the build-up layer structure 60 of the packaging substrate includes a first dielectric layer 62, a second dielectric layer 63, and a third dielectric layer 64. The first dielectric layer 62 and the second dielectric layer 63 include a plurality of vias 44, and the vias 44 further include conductive vias 66 therein. The third dielectric layer 64 is formed over the surface of the second dielectric layer 63, in which the third dielectric layer 64 includes a plurality of patterned openings, and the patterned openings further include circuit 70 therein. As shown in FIG. 8, the circuit 70 is electrically connected to the conductive vias 66. The third dielectric layer 64 is utilized to create a separation for the circuit 70. In addition to the build-up layer structure shown in FIG. 8, the first dielectric layer 62, the second dielectric layer 63, and the third dielectric layer 64 can be formed repeatedly over one another to form a build-up circuit board with multi-layers.

Figure 9:
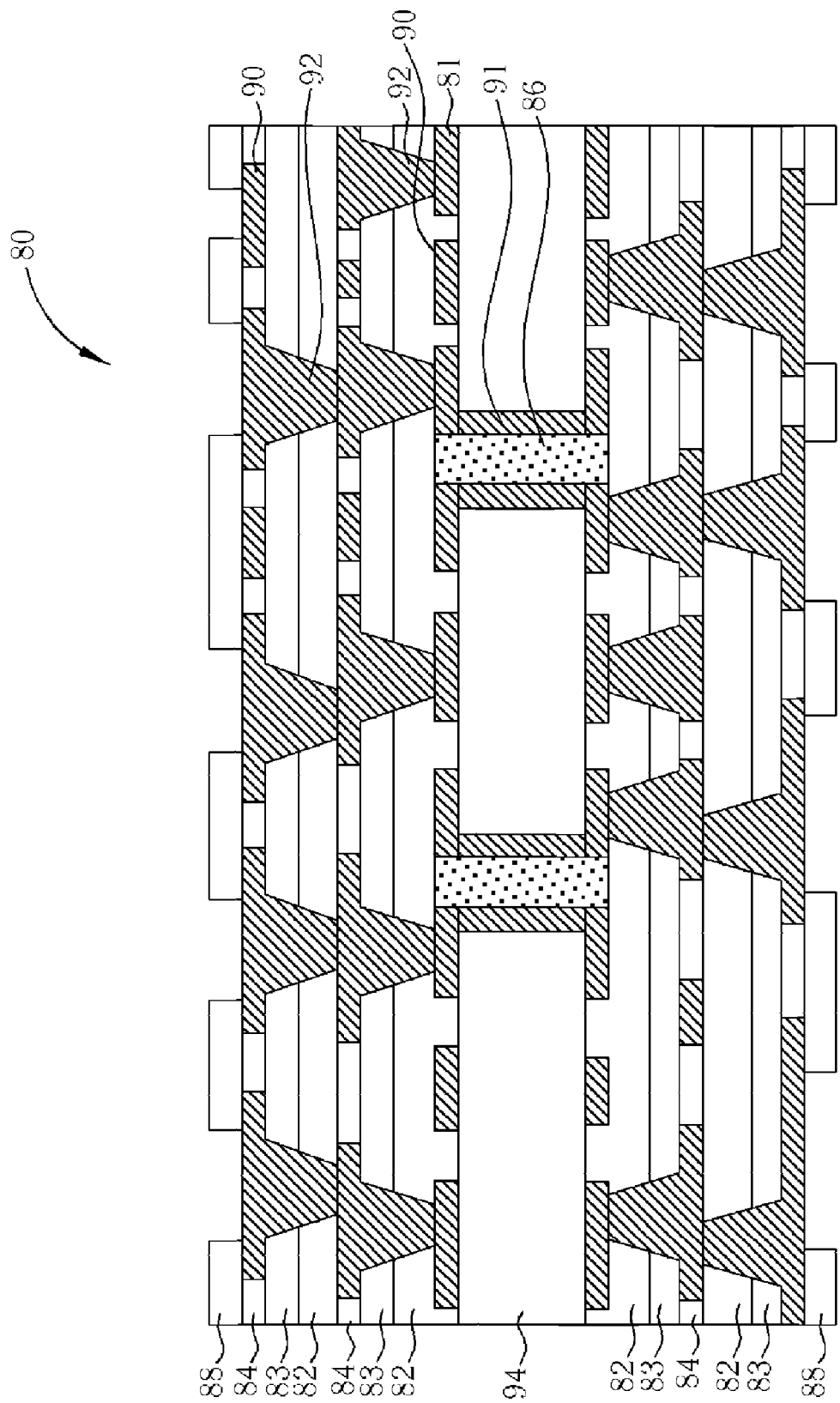
FIG. 9 is a perspective diagram showing the build-up circuit board with fine pitches on both sides of the multi-layer circuit board according to the present invention.

Please refer to FIG. 9. FIG. 9 is a perspective diagram showing the build-up circuit board 80 with fine pitches on both sides of the circuit board according to the second embodiment of the present invention. As shown in FIG. 9, a core substrate 94 includes a plurality of plated through holes (PTH) 91, contact pads 81, and circuit 90, in which the plated through holes 91 are formed by mechanical drilling or electroplating processes. The plated through holes 91 also include a plugging material 86 therein, and each side of the core substrate 94 includes a first dielectric layer 82, a second dielectric layer 83, and a third dielectric layer 84. The first dielectric layer 82 and the second dielectric layer 83 include a plurality of vias 44 corresponding to the contact pads 81 of the core substrate 94, and the vias 44 further include conductive vias 92 therein. The third dielectric layer 84 is formed over the surface of the second dielectric layer 83, in which the third dielectric layer 84 includes a plurality of patterned openings and the patterned openings further include circuit 90 therein. The circuit 90 is electrically connected to the contact pads 81 through the conductive vias 92 and the third dielectric layer 84 is utilized to create a separation for the circuit 90. Lastly, a solder mask layer 88 is disposed on the external layer of the build-up structure to serve as a protective layer. In addition to the structure shown in FIG. 9, the first dielectric layer 82, the second dielectric layer 83, and the third dielectric layer 84 can be formed repeatedly on one side or both sides of the core substrate 94 to achieve a multi-layer build-up circuit board with fine pitches.

In contrast to the conventional method, the present invention provides a method of forming a plurality of patterned openings and via within a dielectric layer and depositing conductive metals into each patterned opening and via, thereby achieving a packaging substrate with much finer pitches, simplifying the fabrication process, lowering costs, and increasing the overall product yield. Additionally, the present invention is applicable to various circuit board packaging techniques, including: plastic ball grid array (PBGA), flip-chip chip scale package (FCCSP), chip scale package (CSP), flip-chip ball grid array (FCBGA), daughter card, module substrates, high density PWB, and embedded substrates.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A build-up layer circuit board with fine pitches comprising:
    a core substrate having a plurality of contact pads thereon;
    a first dielectric layer formed on the surface of the core substrate;
    a second dielectric layer formed on the surface of the first dielectric layer;
    a plurality of conductive vias corresponding to the contact pads and disposed in the first dielectric layer and the second dielectric layer;
    a third dielectric layer on the surface of the second dielectric layer;
    a plurality of circuits disposed in the third dielectric layer, wherein the circuits are flushed to the surface of the third dielectric layer and electrically connected to the contact pads through the conductive vias; and
    a seed layer disposed between the conductive vias, the circuits, and the first dielectric layer, the second dielectric layer, and the third dielectric layer.

2. The built-up layer circuit board with fine pitches of claim 1, wherein the second dielectric layer and the third dielectric layer are comprised of different materials.

3. The built-up layer circuit board with fine pitches of claim 1, wherein the core substrate is comprised of a double layer substrate, a multi-layer substrate, an organic insulating substrate, an inorganic insulating substrate, a ceramic substrate, or a metal substrate.

4. The built-up layer circuit board with fine pitches of claim 1, wherein the build-up layer can be disposed repeatedly on one side or two sides of the core substrate to form a multi-layer circuit board.

5. A build-up layer with fine pitches of a circuit board comprising:
    a first dielectric layer;
    a second dielectric layer formed on the surface of the first dielectric layer;
    a plurality of conductive vias disposed in the first dielectric layer and the second dielectric layer;
    a third dielectric layer formed on the surface of the second dielectric layer, wherein the third dielectric layer has a plurality of patterned openings;
    a plurality of circuits disposed in the patterned openings and be flushed to the surface of the third dielectric layer and the circuits are electrically connected to the conductive vias; and
    a seed layer disposed between the conductive vias, the circuits, and the first dielectric layer, the second dielectric layer, and the third dielectric layer.

6. The built-up layer with fine pitches of a circuit board of claim 5, wherein the second dielectric layer and the third dielectric layer are comprised of different materials.

\* \* \* \* \*